(12) United States Patent
Kamphuis et al.

(10) Patent No.: US 11,011,446 B2
(45) Date of Patent: May 18, 2021

(54) SEMICONDUCTOR DEVICE AND METHOD OF MAKING A SEMICONDUCTOR DEVICE

(71) Applicant: Nexperia B.V., Nijmegen (NL)

(72) Inventors: Tonny Kamphuis, Lent (NL); Leo van Gemert, Nijmegen (NL); Hans van Rijckevorsel, Ledeacker (NL); Sascha Moeller, Hamburg (DE); Hartmut Buenning, Hamburg (DE); Steffen Holland, Hamburg (DE); Y Kuang Huang, Kang Shan/Kaohsiung (TW)

(73) Assignee: NEXPERIA B.V., Nijmegen (NL)

( * ) Notice: Subject to any disclaimer, the term of this patent is extended or adjusted under 35 U.S.C. 154(b) by 44 days.

(21) Appl. No.: 15/342,285

(22) Filed: Nov. 3, 2016

(65) Prior Publication Data

US 2017/0148697 A1 May 25, 2017

(30) Foreign Application Priority Data

Nov. 20, 2015 (EP) .................................... 15195639

(51) Int. Cl.
*H01L 23/492* (2006.01)
*H01L 21/78* (2006.01)
(Continued)

(52) U.S. Cl.
CPC .... *H01L 23/3114* (2013.01); *H01L 21/32051* (2013.01); *H01L 21/6836* (2013.01);
(Continued)

(58) Field of Classification Search
CPC . H01L 23/3114; H01L 21/6836; H01L 21/78; H01L 23/528; H01L 24/32;
(Continued)

(56) References Cited

U.S. PATENT DOCUMENTS 5,872,396 A 2/1999 Kosaki
5,998,234 A * 12/1999 Murata ................... H01L 21/78
257/E21.599
(Continued)

FOREIGN PATENT DOCUMENTS

WO 2008/157779 A2 12/2008

OTHER PUBLICATIONS

Extended European Search Report for Patent Appln. No. 15195639.8 (dated May 27, 2016).

*Primary Examiner* — Steven H Loke
*Assistant Examiner* — Samuel Park
(74) *Attorney, Agent, or Firm* — Ohlandt, Greeley, Ruggiero & Perle, LLP

(57) ABSTRACT

A semiconductor device and a method of making the same. The device includes a semiconductor substrate having a major surface, a backside and side surfaces extending between the major surface and the backside. The semiconductor device also includes at least one metal layer extending across the backside of the substrate. A peripheral part of the at least one metal layer located at the edge of the substrate between the backside and at least one of the side surfaces extends towards a plane containing the major surface. This can prevent burrs located at the peripheral part of the at least one metal layer interfering with the mounting of the backside of the substrate on the surface of a carrier.

6 Claims, 5 Drawing Sheets

(51) Int. Cl.
   *H01L 23/31*       (2006.01)
   *H01L 21/3205*     (2006.01)
   *H01L 21/683*      (2006.01)
   *H01L 23/528*      (2006.01)
   *H01L 23/00*       (2006.01)
   *H01L 29/06*       (2006.01)

(52) U.S. Cl.
   CPC ............ *H01L 21/78* (2013.01); *H01L 23/528* (2013.01); *H01L 24/32* (2013.01); *H01L 24/83* (2013.01); *H01L 29/0657* (2013.01); *H01L 2221/68327* (2013.01); *H01L 2224/32245* (2013.01); *H01L 2224/83801* (2013.01); *H01L 2924/0105* (2013.01); *H01L 2924/01022* (2013.01); *H01L 2924/01028* (2013.01); *H01L 2924/01029* (2013.01); *H01L 2924/01032* (2013.01); *H01L 2924/01033* (2013.01); *H01L 2924/01047* (2013.01); *H01L 2924/01079* (2013.01); *H01L 2924/10156* (2013.01); *H01L 2924/17747* (2013.01); *H01L 2924/35* (2013.01); *H01L 2924/37* (2013.01)

(58) Field of Classification Search
   CPC ................. H01L 24/83; H01L 29/0657; H01L 21/32051; H01L 2221/68327; H01L 2224/32245; H01L 2224/83801; H01L 2924/35; H01L 2924/01028; H01L 2924/01032; H01L 2924/01033; H01L 2924/01047; H01L 2924/0105; H01L 2924/01079; H01L 2924/10156; H01L 2924/17747; H01L 2924/37; H01L 2924/01022; H01L 24/97; H01L 23/552; H01L 21/561; H01L 24/48; H01L 23/3121; H01L 24/73; H01L 21/568; H01L 24/49; H01L 24/05; H01L 24/16; H01L 24/45; H01L 23/3128; H01L 24/145

See application file for complete search history.

(56) References Cited

U.S. PATENT DOCUMENTS

| | | | |
|---|---|---|---|
| 8,895,363 B2 | 11/2014 | Buenning et al. | |
| 2005/0202651 A1* | 9/2005 | Akram | B28D 1/221 438/463 |
| 2006/0113637 A1 | 6/2006 | Fujita et al. | |
| 2008/0142352 A1* | 6/2008 | Wright | G06F 3/044 200/600 |
| 2012/0034760 A1 | 2/2012 | Schuderer et al. | |
| 2012/0313224 A1* | 12/2012 | Fukuda | H01L 29/0657 257/622 |

\* cited by examiner

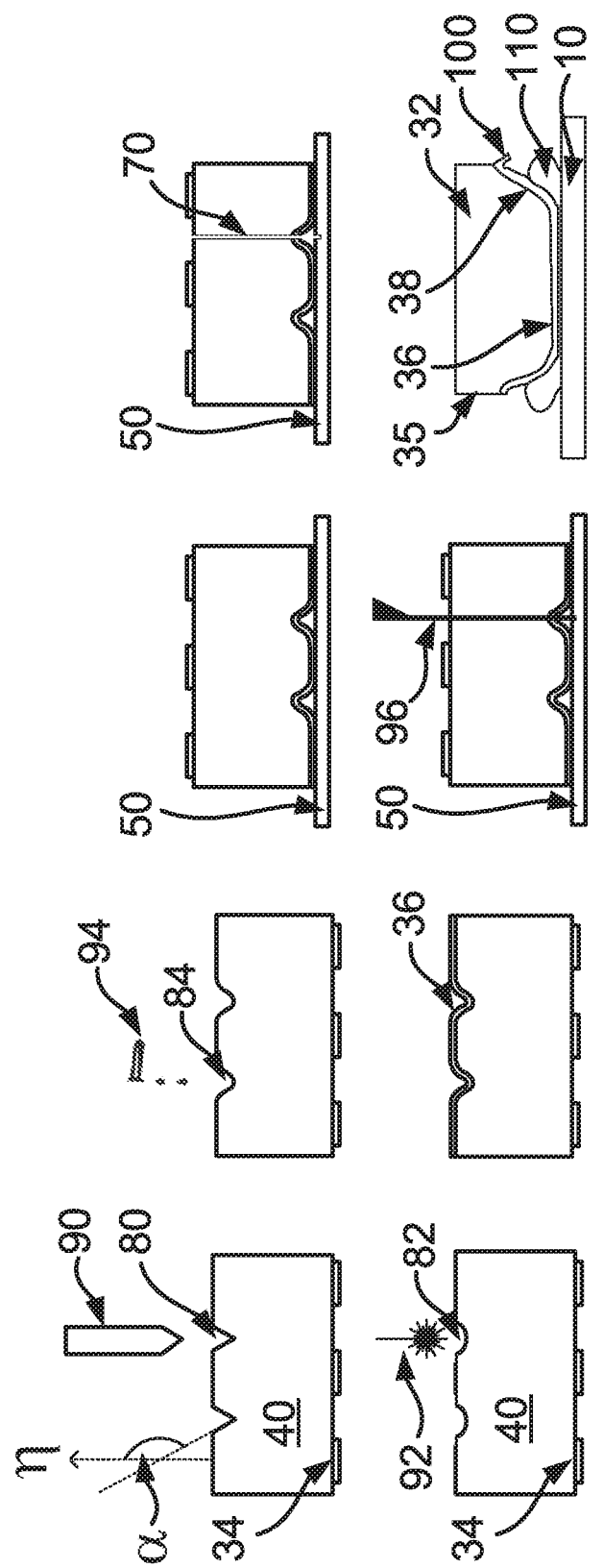

SEMICONDUCTOR DEVICE AND METHOD OF MAKING A SEMICONDUCTOR DEVICE

CROSS-REFERENCE TO RELATED APPLICATIONS

This application claims the priority under 35 U.S.C. § 119 of European Patent application no. 15195639.8, filed on Nov. 20, 2015, the contents of which are incorporated by reference herein.

BACKGROUND

The present specification relates to a semiconductor device and a method of making a semiconductor device.

During singulation of a semiconductor wafer, one or more ductile metal layers located in a stack on the backside of the wafer may produce burrs at the edges of each singulated die. These burrs can protrude downwards beneath the die, which can complicate the process of mounting the backside of the die on the surface of a carrier.

For instance, the burrs can prevent the backside mounting flush against the surface of the carrier, creating a void between the die and the surface of the carrier. Solder that may be used to mount the die on the carrier may also have an adverse chemical reactions with metal layers located inside the stack, that have been exposed at the sides of the stack during the singulation process.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:

a semiconductor substrate having a major surface, a backside and side surfaces extending between the major surface and the backside; and at least one metal layer extending across the backside of the substrate, wherein a peripheral part of the at least one metal layer located at the edge of the substrate between the backside and at least one of the side surfaces extends towards a plane containing the major surface, to prevent burrs located at the peripheral part of the at least one metal layer interfering with the mounting of the backside of the substrate on the surface of a carrier.

Since the peripheral part of the at least one metal layer extends towards a plane containing the major surface, if there are any burrs located at the peripheral part, these may be vertically separated from the backside of the substrate. Accordingly, even if these burrs hang downwards, they may not interfere with the mounting of the substrate on a carrier.

Some embodiments of this disclosure may allow more ductile metals to be used and/or thicker metal layers to be used in backside metallisation processes, owing to the mitigation of problems relating to the formation of burrs and the exposure of the edges of the metal layers in a stack as described below.

A number of different configurations are envisaged for the edges of the substrate between the backside and the side surfaces, for ensuring that the peripheral part of the at least one metal layer extends towards the plane containing the major surface.

In one example, an edge of the substrate between the backside and at least one of the side surfaces may be curved. The peripheral part of the at least one metal layer may extend along the curved edge of the substrate.

In another example, an edge of the substrate between the backside and at least one of the side surfaces may slant upwards at an angle $\alpha$, where $180°>\alpha>90°$, relative to a surface normal of the backside. The peripheral part of the at least one metal layer may extend along the slanted edge of the substrate.

In a further example, an edge of the substrate between the backside and at least one of the side surfaces may include a substantially L-shaped step portion having a corner pointing inwards towards a bulk region of the substrate. The peripheral part of the at least one metal layer may extend along the substantially L-shaped step portion.

In a further example, an edge of the substrate between the backside and at least one of the side surfaces may include a protrusion that extends outwardly from the side surface and that has a surface that extends upwardly towards the plane containing the major surface. The peripheral part of the at least one metal layer may extend along the surface that extends upwardly towards the plane containing the major surface.

Note that each of the approaches noted above may be combined (e.g. some of the edges of the substrate between the backside and the side surfaces may be curved, while others may have an L-shaped step portion, etc.).

The substrate may include one or more active components located at the major surface. The substrate may include one or more contacts located on the major surface.

The at least one metal layer on the backside of the substrate may be provided as a stack of metal layers located on the backside of the substrate. In some examples, the outermost layer of the stack may be exposed, for use as a soldering interface. This outermost layer and/or other layers in the stack may act as a barrier to prevent adverse chemical reactions with underlying metal layers of the stack. The peripheral part of the metal layers in the stack may extend towards a plane containing the major surface. Accordingly, any solder that may be used to mount the backside of the substrate on the surface of the carrier may not come into contact with, and thereby potentially have an adverse chemical reaction with, the edges of one or more of the underlying metal layers inside the stack.

According to another aspect of the present disclosure, there is provided a wafer level chip scale package (WLCSP) including a semiconductor device of the kind described above.

According to a further aspect of the present disclosure, there is provided a method of making a semiconductor device, the method comprising:

providing a semiconductor wafer having a major surface and a backside;

forming an array of trenches in the backside of the substrate;

depositing at least one metal layer on the backside of the wafer, wherein the at least one metal layer extends across the backside of the wafer and coats an inner surface of the trenches; and singulating the wafer substantially along lines defined by the trenches, wherein said singulation produces a plurality of semiconductor devices, each device comprising:

a semiconductor substrate having a major surface corresponding to the major surface of the wafer, a backside corresponding to the backside of the wafer and side surfaces extending between the major surface of the substrate and the backside of the substrate; and at least one metal layer extending across the backside of the substrate, wherein a peripheral part of the at least one metal layer located at the edge of each substrate between the backside and at least one of the side surfaces extends towards a plane containing the major surface of the substrate, to prevent burrs located at the peripheral part of the at least one metal layer interfering with the mounting of the backside of the substrate on the surface of a carrier, and wherein the peripheral part of the at least one metal layer of each substrate corresponds to a part of the at least one metal layer on the backside of the wafer coating the an inner surface of the trenches.

The trenches provided on the backside of the wafer may be used to shape the peripheral part of the at least one metal layer on the backside of each substrate following singulation of the wafer, whereby the peripheral part of the at least one metal layer extends towards a plane containing the major surface of the substrate. If there are any burrs located at the peripheral part, these may thus be vertically separated from the backside of the substrate. Accordingly, even if these burrs hang downwards, they may not interfere with the mounting of the substrate on a carrier.

At least some of the trenches may have rounded corners. This may be implemented by using an etching step to round off the corners of the trenches prior to depositing said least one metal layer on the backside of the wafer. In another example, a laser may be used directly to produce trenches having rounded corners.

At least some of the trenches may be substantially V-shaped. This may be implemented by, for instance, using a saw having a bevelled blade.

At least some of the trenches may be substantially rectangular (e.g. square, oblong)

Singulating the wafer may include sawing the wafer from the major surface of the wafer downwards until the sawing meets the array of trenches in the backside of the substrate. Accordingly, the sawing need not carry on down past the peripheral part of the at least one metal layer, which may prevent the production of burrs hanging down beneath the backside of the substrate of each semiconductor device.

Singulating the wafer substantially along lines defined by the trenches may include sawing the wafer to produce saw lanes having a width that is smaller than a lateral width of the trenches. This may help to ensure that an burrs produced by the singulation process are located away from the backside.

The method may include mounting the backside of the substrate of at least some of the semiconductor devices on the surface of a carrier.

The method may include placing the wafer of a dicing tape after depositing the at least one metal layer on the backside of the wafer and prior to singulating the wafer.

BRIEF DESCRIPTION OF THE DRAWINGS

Embodiments of this disclosure will be described hereinafter, by way of example only, with reference to the accompanying drawings in which like reference signs relate to like elements and in which:

FIGS. 6A to 6D show a process for singulating a semiconductor wafer to produce a plurality of semiconductor devices according to a further embodiment of this disclosure.

DETAILED DESCRIPTION

Embodiments of this disclosure are described in the following with reference to the accompanying drawings.

Figure 1A:
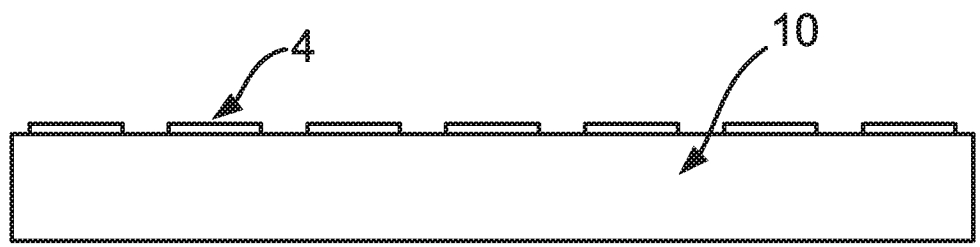
FIGS. 1A to 1C show a process for singulating a semiconductor wafer to produce a plurality of semiconductor devices.
Figure 1B:
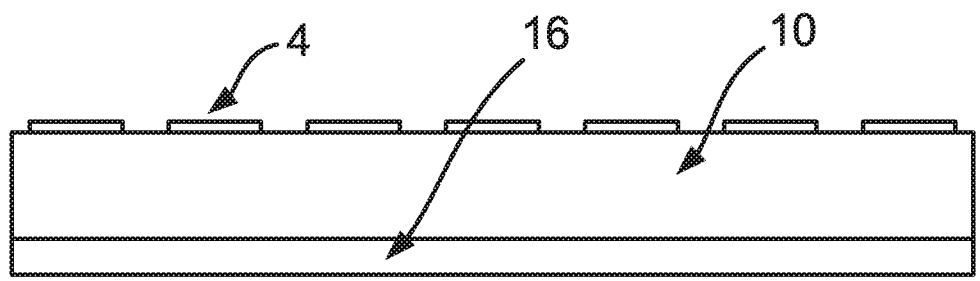
Figure 1C:
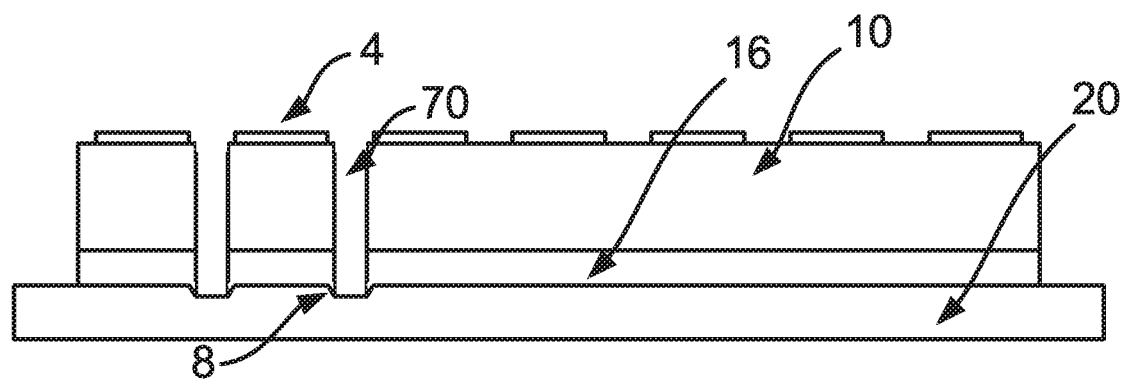

FIGS. 1A to 1C show a process for singulating a semiconductor wafer to produce a plurality of semiconductor devices. In FIG. 1A, there is provided a semiconductor wafer 10. The wafer has a plurality of active regions 4 located on a major surface of the wafer 10. As shown in FIG. 1B, a backside of the wafer, which is the surface of the wafer 10 opposite the major surface, may be provided with at least one metal layer 16. Backside metallisation is well known in the field of semiconductor device manufacture and will not be described here in detail.

Next, as shown in FIG. 1C, the wafer 10 is placed on a dicing tape 20. The dicing tape supports the wafer during singulation. FIG. 1C also shows the singulation of the wafer along saw lanes 70 to produce a number of semiconductor devices comprising separate substrates. Since the metal of the at least one metal layer 16 may be ductile, the sawing can produce burrs 8 at the edges of the substrates. This may be exacerbated by the fact that the saw lanes 70 may extend at least partially into the dicing tape 20.

Figure 2:
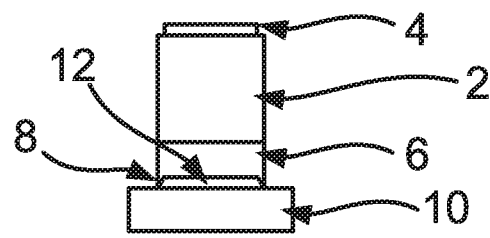
FIG. 2 shows one of the semiconductor devices produced by the example of FIG. 1 mounted on a lead frame.

FIG. 2 shows one of the semiconductor devices produced by the example of FIG. 1 mounted on a lead frame 10. The device includes a substrate 2 having at least one metal layer 6 located on the backside thereof. As can be seen in FIG. 2, the burrs 8 hanging down beneath the substrate 2 can inhibit correct mounting of the substrate 2 on the lead frame 10. For instance, the burrs 8 can prevent the least one metal layer 6 from sitting flush against the surface of the lead frame 10. A void 12 can arise between the surface of the carrier and the at least one metal layer 6. This can prevent correct mechanical, thermal and/or electrical contact being formed between the at least one metal layer 6 and the lead frame 10. As described previously, any solder that is used to mount the substrate 2 on the lead frame 10 may also short with the edges of some of the metal layers of the at least one metal layer 6 that have been exposed by the sawing.

Embodiments of this disclosure can provide a semiconductor device in which any burrs that are formed at a peripheral part of at least one metal layer provided on the backside of a substrate need not necessarily interfere with the mounting of the backside of the substrate on the surface of a carrier. This may be achieved by shaping the peripheral part of the at least one metal layer located at the edge of the substrate between a backside of the substrate and at least one of the side surfaces of the substrate extends towards a plane containing a major surface of the substrate. This shaping of the peripheral part of the at least one metal layer may physically separate any burrs located at the peripheral part of the at least one metal layer from the backside of the substrate, so that they do not hang down beneath the substrate. The shaping of the peripheral part of the substrate in this way may also prevent shorting of the exposed edges of some of the at least one metal later with solder that may be used to mount the substrate on a carrier.

FIGS. 3A to 3D show a process for making a semiconductor device according to an embodiment of this disclosure. In a first step, shown in FIG. 3A, there is provided a semiconductor wafer 40. The wafer 40 may, for instance, comprise a silicon wafer, although other kinds of wafer are also envisaged (e.g. the wafer may comprise GaN).

The wafer 40 has a major surface 22 and a backside 24. The backside 24 is a surface of the wafer 40 opposite the major surface 22. The wafer may be processed using conventional manufacturing techniques to form active regions 34 on the major surface 22. These active regions 34 may include active components such as transistors, diodes, sensors etc. Passive components such as capacitors, inductors and metal tracks connecting together the various components of the active regions 34 may also be provided. The major surface 22 may also be provided with one or more electrical contacts for connecting to the components of the active regions 34.

Figure 3A:
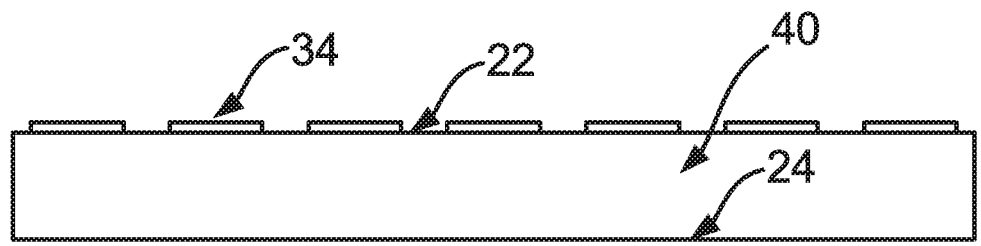
FIGS. 3A to 3D show a process for singulating a semiconductor wafer to produce a plurality of semiconductor devices according to an embodiment of this disclosure.
Figure 3B:
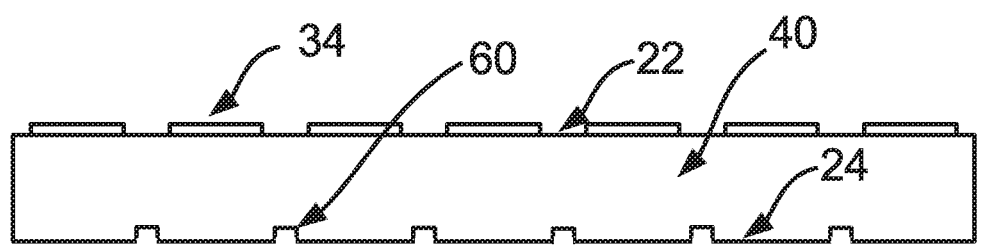

In a next step, shown in FIG. 3B, an array of trenches 60 is formed in the backside of the substrate. The trenches 60 may, for instance, be formed by partial sawing of the backside 24. In other examples, lithographic techniques may be used to mask and wet etch the backside to form the array. In a further example, plasma etching may be used. The array of trenches 60 may have a layout corresponding to the saw lanes that will subsequently be used to singulate the wafer 40. Accordingly, the array of trenches may delineate the plurality of semiconductor substrates that will subsequently be produced by singulating the wafer 40. The array of trenches 60 may be a regular, repetitive array. The array of trenches 60 may, for instance, be a rectangular array (e.g. the substrates to be produced by subsequent singulation of the wafer 40 may be square or oblong).

In a next step, shown in FIG. 3B, at least one metal layer 36 may be deposited on the backside 24 of the wafer 40.

In some examples, there may only be a single metal layer on the backside 24. In other examples, the at least one metal layer 36 may be provided as a stack comprising a plurality of metal layers. An outermost metal layer of the stack can be used to mount the semiconductor device described herein to the surface of a carrier, and the metal used for this outermost layer may be chosen to be compatible with the solder. On the other hand, other metal layers located inside the stack may comprise a metal that may have an adverse chemical reaction with the solder, were that layer to come into contact with the solder. In accordance with embodiments of this disclosure, since a peripheral part of the metal layers in the stack may extend towards a plane containing the major surface, any solder that may be used to mount the backside of the substrate on the surface of the carrier may not come into contact with, and have an adverse chemical reaction with, the edges of one or more of the metal layers inside the stack.

The metal of the at least one metal layer 36 may, for instance, comprise metals such as Cu, Sn. Note that the metal layers may comprise a metal alloy. Where the at least one metal layer is provided as a stack as described herein, the stack may, for instance, include a layer of Cu and a layer of Sn. In such examples, a Cu metal layer in the stack may have an adverse chemical reaction if it comes into contact with solder. As already mentioned above, this problem may be avoided in accordance with embodiments of this disclosure, since a peripheral part of the metal layers in the stack may extend towards a plane containing the major surface.

Further examples include Titanium-Gold-Nickel, Gold-Arsenic or Gold-Germanium, or even pure Silver or Gold on the backside.

Figure 3C:
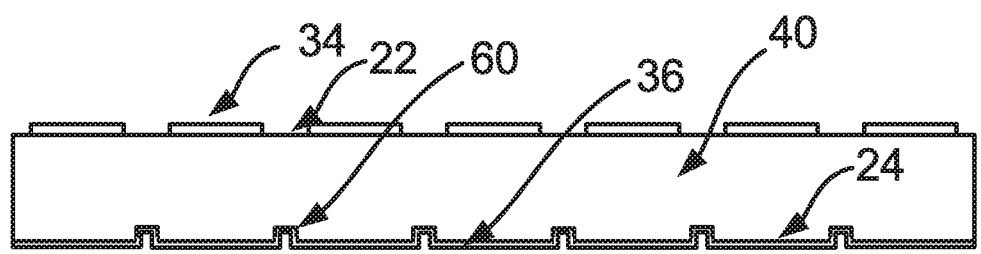

As shown in FIG. 3C, the at least one metal layer 36 extends across the backside 24 of the wafer 40. FIG. 3C also shows that the at least one metal layer 36 also coats an inner surface of the trenches of the array of trenches 60.

Figure 3D:
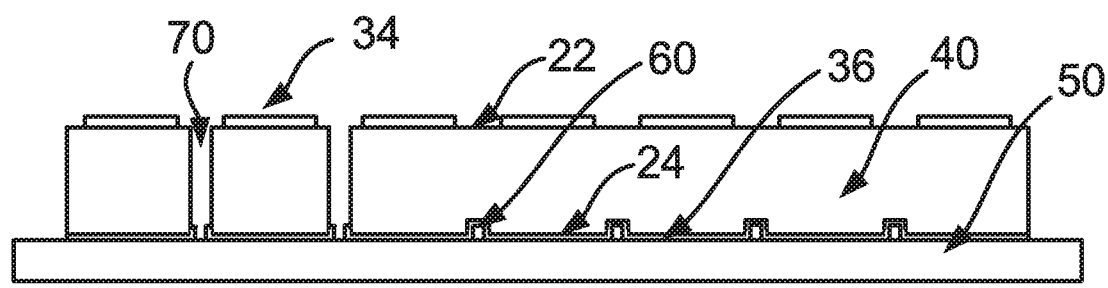

In a next step, shown in FIG. 3D, the wafer 40 is singulated along saw lanes 70 to produce a plurality of semiconductor devices each comprising a respective one of the singulated substrates. In the present example, the saw lanes 70 correspond exactly in position to the layout of the array of trenches 60. As will be described in more detail below in relation to FIGS. 5A to 5D, singulating the wafer 40 along the trenches 60 need not involve aligning the saw lanes 70 precisely with the trenches 60—there may be a degree of tolerance involved. Also, in the present example, the saw lanes 70 are roughly equal in width to the trenches of the array of trenches 60 formed in FIG. 3B. However, as will be described in more detail below in relation to FIGS. 5B, 5C, 5D, 6C and 6D, the saw lanes 70 may be narrower than the trenches of the array of trenches 60.

The sawing of the wafer 40 may begin at the major surface 22 and continue until the sawing reaches to tops of the trenches of the array of trenches 60, at which point the substrates become separated. It may not be necessary for the sawing to continue further down than this point. Indeed, continued sawing of this kind may produce unwanted burrs to be produced, notwithstanding the measured described herein. On the other hand, as described below in relation to FIG. 6, if the saw lanes 70 are narrower than the trenches of the array of trenches 60, this problem may not arise.

Figure 4:
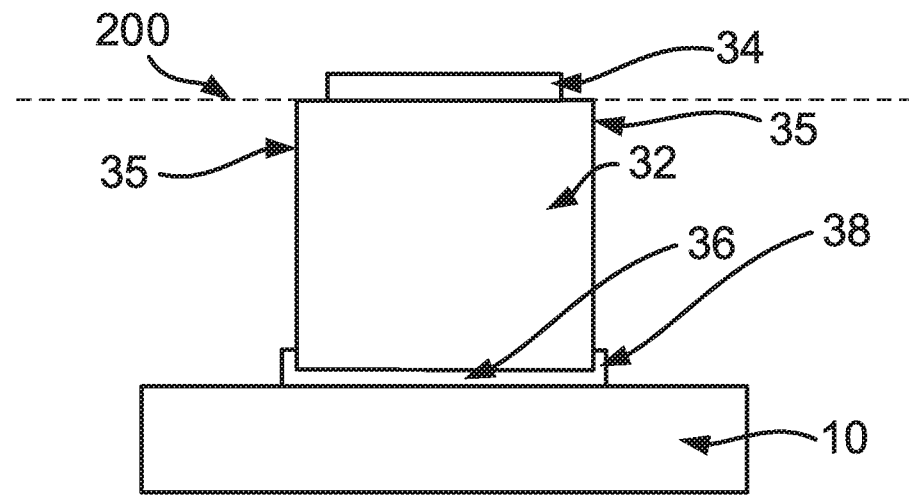
FIG. 4 shows one of the semiconductor devices produced by the process of FIGS. 3A to 3D mounted on a carrier.

FIG. 4 shows one of the semiconductor devices produced by the process of FIGS. 3A to 3D mounted on a carrier 10. The carrier 10 may, for instance, be a lead frame, heat sink or flange. In a further example, the carrier 10 may be a substrate with, for example, a Cu insert for better thermal behavior.

The device includes a semiconductor substrate 32 having a major surface that corresponds to the major surface 22 of the wafer 40 and a backside that corresponds to the backside 24 of the wafer 40. The semiconductor substrate 32 also includes a number of side surfaces 35 (typically there are four such surfaces, in the case of a rectangular substrate).

The major surface of the substrate 32 may include an active region 34 of the kind described above, including one or more active and passive components and one or more electrical contacts.

The device also includes at least one metal layer 36 extending across the backside of the substrate 32, which corresponds to the at least one metal layer 36 described above in relation to FIG. 3C.

As shown in FIG. 4, the at least one metal layer 36 has a peripheral part 38. The peripheral part 38 is located at the edges of the substrate 32, which edges are the edges between the backside and the side surfaces 35 of the substrate. These edges may be configured and shaped in an number of different ways, as described below.

The peripheral part 38 of the at least one metal layer 36 extends towards the plane containing the major surface of the substrate 32. The plane containing the major surface of the substrate 32 is indicated by the dashed line labelled 200 in FIG. 4. In the present example, the peripheral part 38 extends upwards along one or more of the side surfaces 35 of the substrate 32, although other configurations are envisaged, as will be described below. Note that the peripheral part 38 corresponds to a part of the metal coating an inner surface of the array of trenches 60 as described above in relation to FIG. 3C. The effect of shaping the peripheral part 38 of the at least one metal layer 36 in this way is that the at least one metal layer 36 terminates at a location that is physically separated from the back of the substrate 32. Accordingly, any burrs located at the peripheral part 38 of the at least one metal layer tend also to be physically separated from the backside of the substrate 32. Thus, any such burrs, even burrs hanging directly downwards, would tend not to interfere with the mounting of the backside of the substrate 32 on the surface of a carrier 10. As can be seen in FIG. 4, the backside of the substrate 32 sits flush against the surface of the carrier, without there being any void between the substrate 32 and the carrier 10 of the kind described above in relation to FIG. 2.

It is also envisaged that, in cases where the at least one metal layer 36 comprises a plurality of metal layers in a stack, the shaping of the peripheral part 38 in this way may prevent solder unintentionally coming into contact with, and having an adverse chemical reaction with, the edges of any metal layers located inside the stack. This is because the edges of these layers inside the stack may terminate at a location that is physically removed from the location of the solder.

Figure 5A:
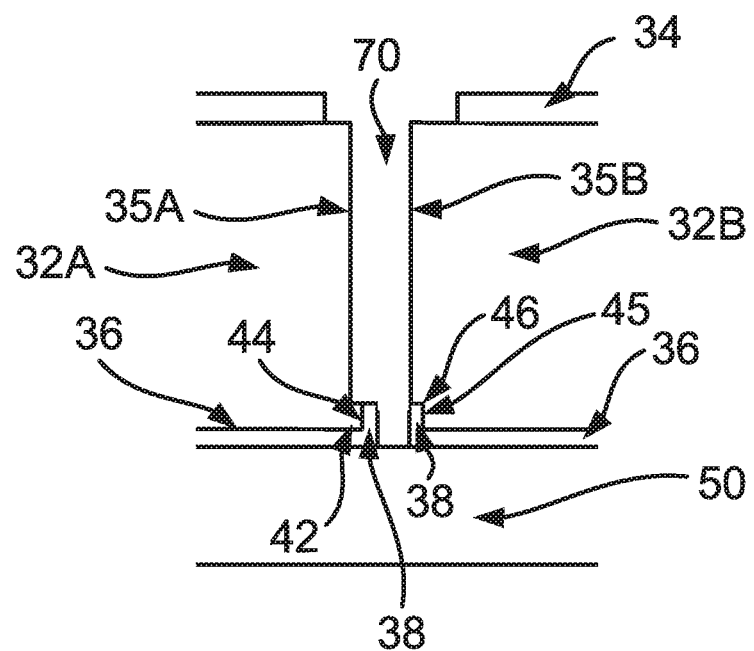
FIGS. 5A to 5D show other examples of the singulation of a semiconductor wafer according to an embodiment of this disclosure.

FIG. 5A shows a one of the saw lanes 70 between two singulated semiconductor substrates 32A, 32B in more detail. As with FIG. 3D, the saw lane 70 in this example is roughly the same width as the trenches of the array of trenches 60 formed in the backside 24 of the wafer 40 prior to singulation. However, in this example, although the wafer 40 has been singulated along the array of trenches 60, the saw lane 70 is not precisely aligned with the trenches.

FIG. 5A demonstrates that there is a degree of tolerance involved in the alignment of the saw lanes 70 with respect to the location of the trenches. Both substrates 32A, 32B include at least one metal layer 36 having a peripheral part 38 that extends towards a plane containing the major surface of that substrate 32A, 32B, and this can prevent burrs located at the peripheral part 38 interfering with the mounting of the backside of the substrate 32A, 32B on the surface of a carrier. However, as a consequence of the slight misalignment between the saw lane 70 and the trench, the edges of the substrate 32A between the backside of the substrate 32A the side surface 35A are shaped differently to the edges of the substrate 32B between the backside of the substrate 32B the side surface 35B.

An edge of the substrate 32A between the backside of the substrate 32A and the side surface 35A includes a protrusion 42 that extends outwardly from the side surface 35A. The protrusion 42 has a surface 44 that extends upwardly (e.g. substantially parallel to the side surface 35A) towards the plane containing the major surface of the substrate 32A. In this example, the peripheral part 38 of the at least one metal layer 36 extends along the surface 44 and thus itself extends upwardly towards the plane containing the major surface.

On the other hand, an edge of the substrate 32B between the backside of the substrate 32B and the side surface 35B includes a substantially L-shaped step portion 45 having a corner 46 that points inwards towards a bulk region of the substrate 32B. In this example, the peripheral part 38 of the at least one metal layer 36 extends along the substantially L-shaped step portion, at least as far as the corner 46.

It will be appreciated that any given substrate 32 produced by the method described herein may include edges between the backside of the substrate 32 side surfaces 35 of the substrate that are shaped and configured in a number of different ways. For instance, it will be appreciated that the substrates 32A, 32B shown in FIG. 5A may each include some edges that include a protrusion 42 and some edges that include a substantially L-shaped step portion 45, depending on the local alignment of the saw lanes 70.

Figure 5B:
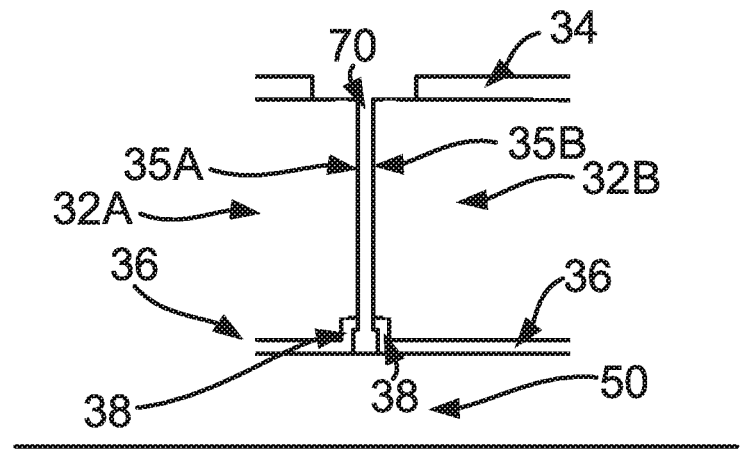
Figure 5C:
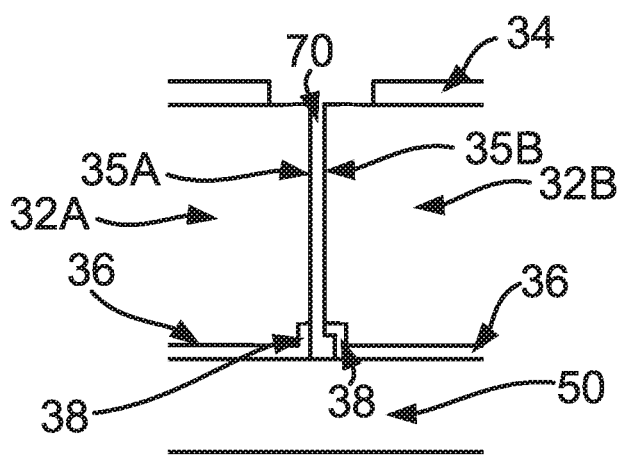
Figure 5D:
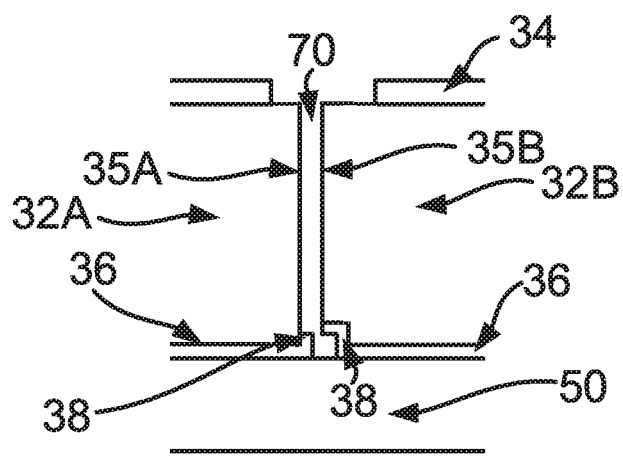

While FIG. 5A demonstrates that there is a degree of tolerance involved in the alignment of the saw lanes 70 with respect to the location of the trenches 60, in the context of a saw lane that is of comparable width to the trenches 60, FIGS. 5B to 5D demonstrate that this is also true in the context of saw lanes 70 that are narrower than the trenches 60.

For instance, in FIG. 5B, the saw lane 70, which is narrower than the trench on the backside of the wafer, is well aligned with the trench. Here, the peripheral part 38 of the at least one metal layer 36 extends towards a plane containing the major surface, as noted previously.

In the example of FIG. 5C, there is some misalignment between the saw lane 70 and the trench on the backside of the wafer. Nevertheless, each of the substrates 32A, 32B still includes a peripheral part 38 of the at least one metal layer 36 extends towards a plane containing the major surface, as noted previously.

In the example of FIG. 5D, there is a larger misalignment between the saw lane 70 and the trench on the backside of the wafer than shown in FIG. 5C. Nevertheless, each of the substrates 32A, 32B still includes a peripheral part 38 of the at least one metal layer 36 extends towards a plane containing the major surface, as noted previously.

FIGS. 6A to 6D show another example of a method of making a semiconductor device according to an embodiment of this disclosure.

Firstly, in FIG. 6A, there is provided a semiconductor wafer 40, which, as noted above may be a silicon wafer or some other kind of wafer. The major surface of the wafer 40 may include active regions 34 of the kind already described.

As shown in FIG. 6A, an array of trenches is formed in the backside of the wafer 40. The trenches described herein may have a depth of around 20 μm, although this would depend upon factors such as the overall thickness of the wafer, the thickness of the trenches and the thickness of the saw lanes produced by subsequent singulation.

The trenches may be formed by using, for instance, a saw blade 90 having a bevelled tip. The bevelled tip can produce trenches 80 that are substantially V-shaped. When the wafer 40 is subsequently singulated along the trenches, this can produce semiconductor substrates having an edge between the backside of the substrate and at least one of the side surfaces of the substrate that slants upwards at an angle $180°>\alpha>90°$ relative to a surface normal η of the backside of the substrate. In such examples, peripheral part 38 of the at least one metal layer 36 on the backside of the substrate can extend along the slanted edge of the substrate, thereby to extend towards the plane containing the major surface of the substrate, to prevent any burrs located at the peripheral part 38 interfering with the mounting of the backside of the substrate on the surface of a carrier.

In another example, as also shown in FIG. 6A, a laser 92 may be used to form trenches 82 having a curved profile. Trenches of this kind can also be used to ensure that, after singulation, the peripheral part 38 of the at least one metal layer 36 on the backside of the substrate extends towards the plane containing the major surface of the substrate.

In FIG. 6B, an optional step for rounding off the corners of the trenches may be performed. This step may include using an etchant 94 to etch away the sharp corners of the trenches, to produced trenches 84 having a rounded profile. Note that this etching step may be applied to trenches formed by any of the methods described above in relation to FIGS. 3B and 6A. Rounding off of the sharp corners of the trenches in this way may reduce flaking and delamination of the peripheral part of the at least on metal layer on each semiconductor substrate after singulation.

Following the optional etching step described above, at least one metal layer 36 may be deposited on the backside of the wafer 40 as already described above in relation to FIG. 3C. The at least one metal layer 36 extends across the backside of the wafer 40 and coats an inner surface of the trenches. As already noted, in some examples, the at least one metal layer 36 may comprise a stack including a plurality of metal layers located on the backside of the wafer 40.

The wafer 40 may then be placed on a dicing tape 50 as shown in FIG. 6C. In particular, the wafer 40 may be placed on the dicing tape 50 with the backside facing downwards against the surface of the dicing tape 50.

Next, the wafer 40 may be singulated, as also illustrated in FIG. 6C. The singulation of the wafer may be achieved using a saw blade 96 or by any other suitable method (e.g. by laser sawing). The wafer 40 is singulated substantially along lines defined by the trenches, as already discussed. In the present example, the saw lanes 70 (see FIG. 6D) are narrower than the trenches. In such examples, it may not be necessary for the sawing to stop at the point at which the saw lanes meet the tops of the trenches. Due to the relative narrowness of the saw lanes, even in the sawing continues down into dicing tape 50 (as shown in FIG. 6D), any burrs formed by the sawing would still tend to be located away from the backside of each singulated substrate.

FIG. 6D also shows one of the substrates 32 formed by the method described above mounted on the surface of a carrier 10 such as a lead frame. Note that in this example, the edges of the substrate 32 between the backside and the side surfaces 35 are curved. Note also that the peripheral part 38 of the at least one metal layer 36 extends along the curved edge of the substrate, and thus extends towards a plane containing the major surface of the substrate 32.

FIG. 6D further shows a burr 100 located at the peripheral part 38 of the at least one metal layer 36 and illustrates that, because the peripheral part 38 extends towards a plane containing the major surface of the substrate 32, the burr 100 is physically separated from the backside of the substrate 32 and does not interfere with the mounting of the substrate 32 on the carrier 10.

Also shown in FIG. 6D is a portion of solder 110 that is used, in this example, to mount the substrate 32 on the surface of the carrier 10. Note that because the peripheral part 38 extends towards a plane containing the major surface of the substrate 32, the edges of any metal layer(s) of the at least one metal layer 36 are physically separated from the solder 110. For instance, this can prevent the solder 110 coming into contact with, and potentially having an adverse chemical reaction with, any exposed edges of metal layers located within the stack located on the backside of the substrate 32.

In some embodiments, the semiconductor device described herein may be a wafer level chip scale package (WLCSP).

Accordingly, there has been described a semiconductor device and a method of making the same. The device includes a semiconductor substrate having a major surface, a backside and side surfaces extending between the major surface and the backside. The semiconductor device also includes at least one metal layer extending across the backside of the substrate. A peripheral part of the at least one metal layer located at the edge of the substrate between the backside and at least one of the side surfaces extends towards a plane containing the major surface. This can prevent burrs located at the peripheral part of the at least one metal layer interfering with the mounting of the backside of the substrate on the surface of a carrier.

Although particular embodiments of this disclosure have been described, it will be appreciated that many modifications/additions and/or substitutions may be made within the scope of the claims.

The invention claimed is:

1. A semiconductor device comprising:
   a semiconductor substrate having a major surface comprising an active region, a backside surface and a plurality of side surfaces extending between the major surface and the backside surface opposite the major surface; and
   at least one metal layer extending across the backside surface of the semiconductor substrate, wherein at least portions of the at least one metal layer on the backside surface of the semiconductor substrate are configured to be mounted directly in contact with a surface of a carrier,
   wherein the at least one metal layer has a peripheral part that is located at an edge of the semiconductor substrate between the backside surface and at least one of the plurality of side surfaces that extends towards a plane containing the major surface and wherein the peripheral part is adapted to prevent burrs located at the peripheral part of the at least one metal layer from interfering with mounting of the backside surface of the semiconductor substrate on the surface of the carrier, wherein the edge of the semiconductor substrate between the backside surface and the at least one of the plurality of side surfaces includes a substantially L-shaped step portion having a corner pointing inwards towards a bulk region of the semiconductor substrate, and wherein the peripheral part of the at least one metal layer extends along the substantially L-shaped step portion and is not abutting to the active region of the major surface,
   wherein the active region comprises one or more active components located on the major surface and opposite the backside surface.

2. The semiconductor device of claim 1, wherein the at least one metal layer comprises a stack of metal layers located on the backside surface of the semiconductor substrate.

3. A wafer level chip scale package comprising the semiconductor device of claim 1.

4. A method of making a plurality of the semiconductor device of claim 1, the method comprising:
   providing a wafer having a wafer major surface and a wafer backside surface opposite the wafer major surface;
   providing a plurality of active regions comprising the one or more active components located on or in the wafer major surface;
   forming an array of trenches in the wafer backside surface;
   depositing at least one wafer metal layer on the wafer backside surface, wherein the at least one wafer metal layer extends across the wafer backside surface and coats a n inner surface of each of the trenches; and
   singulating the wafer to produce the plurality of the semiconductor device of claim 1.

5. The method of claim 4, wherein singulating the wafer comprises sawing the wafer from the wafer major surface downwards until the sawing meets the array of trenches in the wafer backside surface, wherein a sawing width is less than a width of each of the trenches.

6. The Semiconductor of claim 4, wherein the substantially L-shaped step portion of the peripheral part of the at least one metal layer abuts the bulk region.

* * * * *